(12) United States Patent
Tsai et al.

(10) Patent No.: US 10,756,674 B2
(45) Date of Patent: Aug. 25, 2020

(54) AMPLIFIER

(71) Applicant: Faraday Technology Corp., Hsinchu (TW)

(72) Inventors: Hsu-Ming Tsai, Hsinchu (TW); Ta-Wei Wang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 95 days.

(21) Appl. No.: 16/248,795

(22) Filed: Jan. 16, 2019

(65) Prior Publication Data

US 2020/0162025 A1    May 21, 2020

(30) Foreign Application Priority Data

Nov. 20, 2018  (TW) .............................. 107141258 A (51) Int. Cl.
  *H03F 1/02*   (2006.01)
  *H03F 3/45*   (2006.01)
(52) U.S. Cl.
  CPC ....... *H03F 1/0211* (2013.01); *H03F 3/45188* (2013.01); *H03F 2203/45212* (2013.01); *H03F 2203/45214* (2013.01)
(58) Field of Classification Search
  CPC .................................................. H03F 1/0211
  See application file for complete search history.

(56) References Cited

U.S. PATENT DOCUMENTS

| | | | |
|---|---|---|---|
| 6,087,897 A * | 7/2000 | Wang | .................. H03F 3/45479 327/124 |
| 6,677,880 B2 | 1/2004 | Yamamoto | |
| 8,120,442 B2 | 2/2012 | Lee et al. | |
| 2006/0091955 A1* | 5/2006 | Choi | ...................... H03F 3/3022 330/260 |
| 2013/0002356 A1* | 1/2013 | Huang | ................ H03F 3/45183 330/261 |
| 2014/0009191 A1* | 1/2014 | Chen | ................... H03F 3/45219 327/109 |

(Continued)

FOREIGN PATENT DOCUMENTS

| TW | 201433899 | 9/2014 |
|---|---|---|
| TW | 201832460 | 9/2018 |
| TW | 201836263 | 10/2018 |

OTHER PUBLICATIONS

"Office Action of Taiwan Counterpart Application," dated Feb. 14, 2019, p. 1-p. 4.

*Primary Examiner* — Patricia T Nguyen
(74) *Attorney, Agent, or Firm* — Winston Hsu (57) ABSTRACT

An amplifier including a first routing circuit, an input stage circuit, an output stage circuit, a second routing circuit, and a bias voltage generating circuit is provided. The bias voltage generating circuit generates a first bias voltage and a second bias voltage for respectively supplying a first tail current source and a second tail current source of the input stage circuit. During a first period, the first bias voltage is related to the voltage at a first input terminal of the amplifier, and the second bias voltage is related to the voltage at a second input terminal of the amplifier. During a second period, the first bias voltage is related to the voltage at the second input terminal of the amplifier, and the second bias voltage is related to the voltage at the first input terminal of the amplifier.

14 Claims, 5 Drawing Sheets

(56) References Cited

U.S. PATENT DOCUMENTS

| | | | |
|---|---|---|---|
| 2014/0028395 A1* | 1/2014 | Chan | H03F 3/45179 |
| | | | 330/260 |
| 2015/0061767 A1* | 3/2015 | Francis | H03F 3/45188 |
| | | | 330/258 |
| 2018/0076780 A1* | 3/2018 | Wang | H03M 3/00 |
| 2018/0323748 A1* | 11/2018 | Motoroiu | H03F 3/45183 |

* cited by examiner

AMPLIFIER

CROSS-REFERENCE TO RELATED APPLICATION

This application claims the priority benefit of Taiwan application serial no. 107141258, filed on Nov. 20, 2018. The entirety of the above-mentioned patent application is hereby incorporated by reference herein and made a part of this specification.

BACKGROUND

Field of the Invention

The invention relates to an electronic circuit and more particularly, to an amplifier.

Description of Related Art

Amplifiers are commonly applied in various electronic circuit products. Based on design requirements, the amplifiers may probably include operational amplifiers (OPs), differential amplifiers (DAs), differential difference amplifiers (DDAs), transduction amplifiers or other amplifiers. Based on variation of processes and/or other factors, the amplifiers usually have offset voltages. How to eliminate the offset voltages is an important issue to the technical field related to the amplifiers.

SUMMARY

The invention provides an amplifier using routing circuits as choppers for offsetting offset voltages.

According to an embodiment of the invention, an amplifier is provided. The amplifier includes a first routing circuit, an input stage circuit, an output stage circuit, a second routing circuit and a bias voltage generating circuit. A first input terminal and a second input terminal of the first routing circuit are respectively coupled to a first input terminal and a second input terminal of the amplifier. A first input terminal and a second input terminal of the input stage circuit are respectively coupled to a first output terminal and a second output terminal of the first routing circuit. A first input terminal and a second input terminal of the output stage circuit are respectively coupled to a first output terminal and a second output terminal of the input stage circuit. A first input terminal and a second input terminal of the second routing circuit are respectively coupled to a first output terminal and a second output terminal of the output stage circuit. A first output terminal and a second output terminal of the second routing circuit are respectively coupled to a first output terminal and a second output terminal of the amplifier. According to voltages of the of the first input terminal and the second input terminal of the amplifier, the bias voltage generating circuit is configured to generate a first bias voltage and a second bias voltage respectively provided to a first tail current source and a second tail current source of the input stage circuit. During a first period, the first bias voltage is related to the voltage of the first input terminal of the amplifier, and the second bias voltage is related to the voltage of the second input terminal of the amplifier. During a second period, the first bias voltage is related to the voltage of the second input terminal of the amplifier, and the second bias voltage is related to the voltage of the first input terminal of the amplifier.

According to another embodiment of the invention, an amplifier is provided. The amplifier includes a first routing circuit, an input stage circuit, an output stage circuit, a second routing circuit, a first compensation capacitor, a second compensation capacitor and a third routing circuit. A first input terminal and a second input terminal of the first routing circuit are respectively coupled to a first input terminal and a second input terminal of the amplifier. A first input terminal and a second input terminal of the input stage circuit are respectively coupled to a first output terminal and a second output terminal of the first routing circuit. A first input terminal and a second input terminal of the output stage circuit are respectively coupled to a first output terminal and a second output terminal of the input stage circuit. A first input terminal and a second input terminal of the second routing circuit are respectively coupled to a first output terminal and a second output terminal of the output stage circuit. A first output terminal and a second output terminal of the second routing circuit are respectively coupled to a first output terminal and a second output terminal of the amplifier. A first terminal of the first compensation capacitor is coupled to a first output terminal of the second routing circuit. A first terminal of the second compensation capacitor is coupled to the second output terminal of the second routing circuit. A first terminal and a second terminal of the third routing circuit are respectively coupled to a second terminal of the first compensation capacitor and a second terminal of the second compensation capacitor. A third terminal and a fourth terminal of the third routing circuit are respectively coupled to the first output terminal and the second output terminal of the input stage circuit. During a first period, the third routing circuit selectively couples the second terminal of the first compensation capacitor to the first output terminal of the input stage circuit and selectively couples the second terminal of the second compensation capacitor to the second output terminal of the input stage circuit. During a second period, the third routing circuit selectively couples the second terminal of the first compensation capacitor to the second output terminal of the input stage circuit and selectively couples the second terminal of the second compensation capacitor to the first output terminal of the input stage circuit.

To sum up, the amplifier provided by the embodiments of the invention uses the first routing circuit and the second routing circuit as choppers for offsetting offset voltages. In some embodiments, during a switching process of the routing circuits, the bias voltage generating circuit can synchronously change between the first bias voltage and the second bias voltage, so as to maintain a gain linearity of the amplifier. In some other embodiments, during the switching process of the routing circuits, the first compensation capacitor and the second compensation capacitor can synchronously exchange with each other, so as to improve a slew rate.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. Moreover, wherever possible, components/members/steps using the same referral numerals in the drawings and description refer to the same or like parts. Components/members/steps using the same referral numerals or using the same terms in different embodiments may cross-refer related descriptions.

Figure 1:
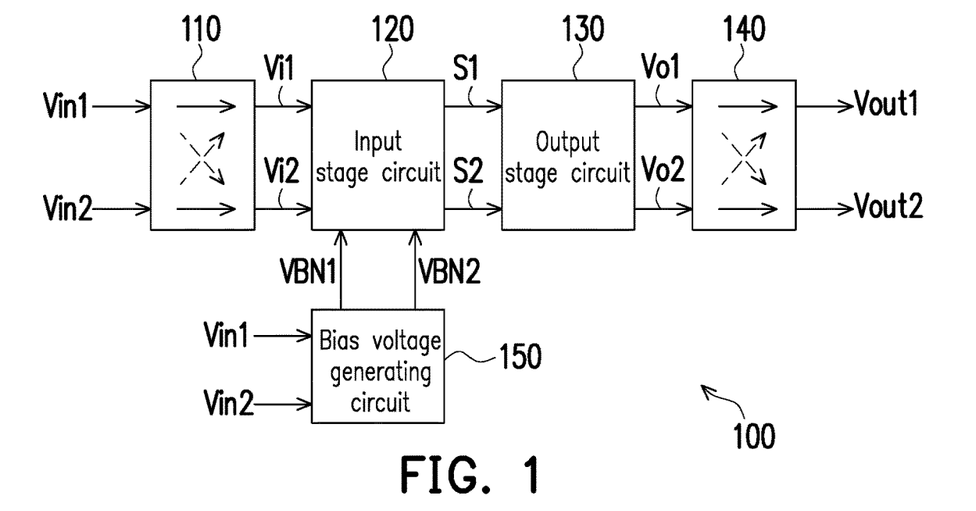
FIG. 1 is a schematic circuit block diagram illustrating an amplifier according to an embodiment of the invention.

FIG. 1 is a schematic circuit block diagram illustrating an amplifier 100 according to an embodiment of the invention. Based on a design requirement, the amplifier 100 illustrated in FIG. 1 may be configured as an operational amplifier (OP), a differential amplifier (DA), a differential difference amplifier (DDA), a transduction amplifier or other amplifiers.

The amplifier 100 includes a first routing circuit 110, an input stage circuit 120, an output stage circuit 130, a second routing circuit 140 and a bias voltage generating circuit 150. A first input terminal of the first routing circuit 110 is coupled to a first input terminal of the amplifier 100 to receive a voltage Vin1 of the first input terminal of the amplifier 100. Based on a design requirement, the voltage Vin1 may be a single-end signal, a differential signal or a signal of any other type. A second input terminal of the first routing circuit 110 is coupled to a second input terminal of the amplifier 100 to receive a voltage Vin2 of the second input terminal of the amplifier 100. Based on a design requirement, the voltage Vin2 may be a single-end signal, a differential signal or a signal of any other type.

A first input terminal of the input stage circuit 120 is coupled to a first output terminal of the first routing circuit 110 to receive an input signal Vi1. A second input terminal of the input stage circuit 120 is coupled to a second output terminal of the first routing circuit 110 to receive an input signal Vi2. During a first period, the first input terminal of the first routing circuit 110 is selectively coupled to the first output terminal of the first routing circuit 110, and the second input terminal of the first routing circuit 110 is selectively coupled to the second output terminal of the first routing circuit 110. Thus, during the first period, the first routing circuit 110 transmits the voltage Vin1 to the first input terminal of the input stage circuit 120 to serve as the input signal Vi1 and transmits the voltage Vin2 to the second input terminal of the input stage circuit 120 to serve as the input signal Vi2. After the first period ends, a second period is entered. During the second period, the first input terminal of the first routing circuit 110 is selectively coupled to the second output terminal of the first routing circuit 110, and the second input terminal of the first routing circuit 110 is selectively coupled to the first output terminal of the first routing circuit 110. Thus, during the second period, the first routing circuit 110 transmits the voltage Vin1 to the second input terminal of the input stage circuit 120 to serve as the input signal Vi2 and transmits the voltage Vin2 to the first input terminal of the input stage circuit 120 to serve as the input signal Vi1. After the second period ends, the first routing circuit 110 again enters the first period. As operating repeatedly in this way, the first routing circuit 110 may serve as a chopper for offsetting an offset voltage.

Based on a design requirement, the input stage circuit 120 may include one or more differential input pairs (input transistor pairs). For instance, when the amplifier 100 is configured as a differential difference amplifier, the input stage circuit 120 may include two differential input pairs, wherein the first differential input pair is configured with a first tail current source, and the second differential input pair is configured with a second tail current source. The implementation manner of the input stage circuit 120 is not limited in the embodiment. For instance, based on a design requirement, the input stage circuit 120 may be a conventional input stage circuit or other input stage circuits.

The bias voltage generating circuit 150 is coupled to the input stage circuit 120 to provide a first bias voltage VBN1 and a second bias voltage VBN2 to the first tail current source and the second tail current source of the input stage circuit 120. According to the voltage Vin1 of the first input terminal and the voltage Vin2 of the second input terminal of the amplifier 100, the bias voltage generating circuit 150 may correspondingly generate the first bias voltage VBN1 and the second bias voltage VBN2.

During the first period, the first bias voltage VBN1 is related to the voltage Vin1 of the first input terminal of the amplifier 100, and the second bias voltage VBN2 is related to the voltage Vin2 of the second input terminal of the amplifier 100. In other words, during the first period, the first bias voltage VBN1 is unrelated to the voltage Vin2, and the second bias voltage VBN2 is unrelated to the voltage Vin1. The first bias voltage VBN1 is independent of the second bias voltage VBN2. For instance, during the first period, the first bias voltage VBN1 changes along with a common mode voltage of the voltage Vin1, and the second bias voltage VBN2 changes along with a common mode voltage of voltage Vin2.

During the second period, the first bias voltage VBN1 is related to the voltage Vin2 of the second input terminal of the amplifier 100, and the second bias voltage VBN2 is related to the voltage Vin1 of the first input terminal of the amplifier 100. In other words, during the second period, the first bias voltage VBN1 is unrelated to the voltage Vin1, and the second bias voltage VBN2 is unrelated to the voltage Vin2. For instance, during the second period, the first bias voltage VBN1 changes along with the common mode voltage of the voltage Vin2, and the second bias voltage VBN2 changes along with the common mode voltage of the voltage Vin1.

During the first period, the voltage Vin1 serves as the input signal Vi1 and is transmitted to the first differential input pair of the input stage circuit 120, and thus, the bias voltage generating circuit 150 provides the first bias voltage VBN1 related to the voltage Vin1 to the first tail current source of the first differential input pair. During the first period, the voltage Vin2 serves as the input signal Vi2 and is transmitted to the second differential input pair of the input stage circuit 120, and thus, the bias voltage generating circuit 150 provides the second bias voltage VBN2 related to the voltage Vin2 to the second tail current source of the second differential input pair.

During the second period, the voltage Vin2 serves as the input signal Vi1 and is transmitted to the first differential input pair of the input stage circuit 120, and thus, the bias voltage generating circuit 150 provides the first bias voltage VBN1 related to the voltage Vin2 to the first tail current source of the first differential input pair. During the second period, the voltage Vin1 serves as the input signal Vi2 and is transmitted to the second differential input pair of the input stage circuit 120, and thus, the bias voltage generating circuit 150 provides the second bias voltage VBN2 related to the voltage Vin1 to the second tail current source of the second differential input pair.

Based on the operations of the bias voltage generating circuit 150, during the switching process of the first routing circuit 110, the bias voltage generating circuit 150 may synchronously change the first bias voltage VBN1 and the second bias voltage VBN2. Thus, during the switching process of the first routing circuit 110, the bias voltage generating circuit 150 may maintain a gain linearity of the amplifier 100.

A first input terminal of the output stage circuit 130 is coupled to a first output terminal of the input stage circuit 120 to receive a signal S1. A second input terminal of the output stage circuit 130 is coupled to a second output terminal of the input stage circuit 120 to receive a signal S2. The implementation manner of the output stage circuit 130 is not limited in the embodiment. For instance, based on a design requirement, the output stage circuit 130 may include a gain stage circuit, a buffer circuit and/or other output circuits. In some applications, the output stage circuit 130 may be a conventional output stage circuit or other output stage circuits.

A first input terminal of the second routing circuit 140 is coupled to a first output terminal of the output stage circuit 130 to receive a first output signal Vo1. A second input terminal of the second routing circuit 140 is coupled to a second output terminal of the output stage circuit 130 to receive a second output signal Vo2. A first output terminal of the second routing circuit 140 is coupled to a first output terminal of the amplifier 100 to provide a first output voltage Vout1 of the amplifier 100. A second output terminal of the second routing circuit 140 is coupled to a second output terminal of the amplifier 100 to provide a second output voltage Vout2 of the amplifier 100.

During the first period, the first input terminal of the second routing circuit 140 is selectively coupled to the first output terminal of the second routing circuit 140, and the second input terminal of the second routing circuit 140 is selectively coupled to the second output terminal of the second routing circuit 140. Thus, when the voltage Vin1 serves the input signal Vi1 and is transmitted to the first differential input pair of the input stage circuit 120, the second routing circuit 140 transmits the first output signal Vo1 to the first output terminal of the amplifier 100 to serve as the first output voltage Vout1. When the voltage Vin2 serves as the input signal Vi2 and is transmitted to the second differential input pair of the input stage circuit 120, the second routing circuit 140 transmits the second output signal Vo2 to the second output terminal of the amplifier 100 to serve as the second output voltage Vout2.

During the second period, the first input terminal of the second routing circuit 140 is selectively coupled to the second output terminal of the second routing circuit 140, and the second input terminal of the second routing circuit 140 is selectively coupled to the first output terminal of the second routing circuit 140. Thus, when the voltage Vin2 serves as the input signal Vi1 and is transmitted to the first differential input pair of the input stage circuit 120, the second routing circuit 140 transmits the first output signal Vo1 to the second output terminal of the amplifier 100 to serve as the second output voltage Vout2. When the voltage Vin1 serves as the input signal Vi2 and is transmitted to the second differential input pair of the input stage circuit 120, the second routing circuit 140 transmits the second output signal Vo2 to the first output terminal of the amplifier 100 to serve as the first output voltage Vout1.

Figure 2:
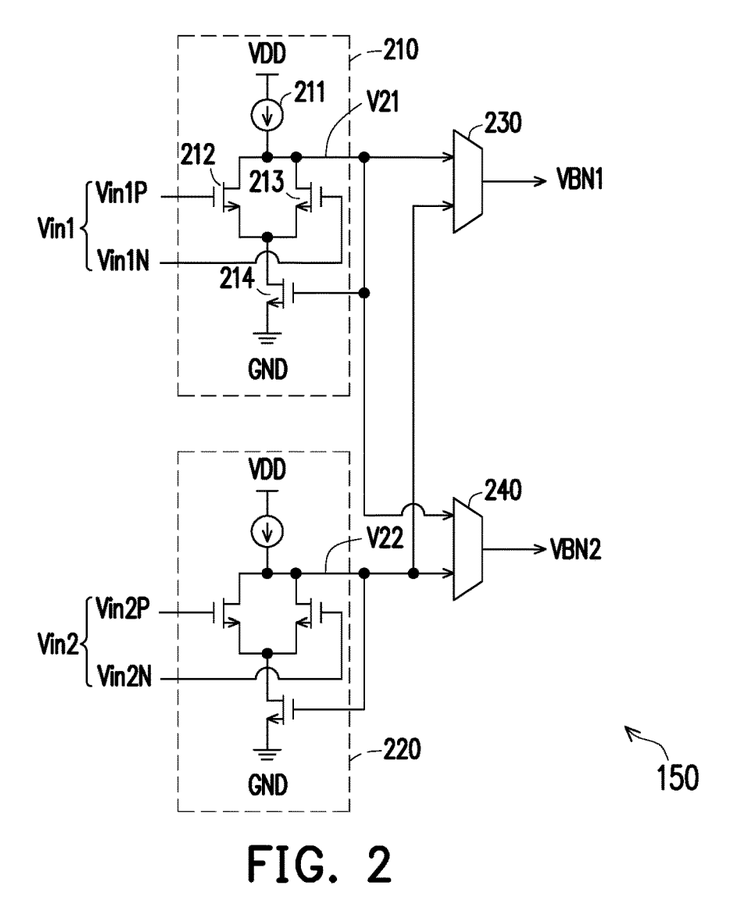
FIG. 2 is a schematic circuit block diagram illustrating the bias voltage generating circuit depicted in FIG. 1 according to an embodiment of the invention.

FIG. 2 is a schematic circuit block diagram illustrating the bias voltage generating circuit 150 depicted in FIG. 1 according to an embodiment of the invention. In the embodiment illustrated in FIG. 2, the bias voltage generating circuit 150 includes a first voltage generating circuit 210, a second voltage generating circuit 220, a first multiplexer (switch) 230 and a second multiplexer (switch) 240. The first voltage generating circuit 210 may generate a first voltage V21, wherein the first voltage V21 is related to the voltage Vin1 of the first input terminal of the amplifier 100. For instance, the first voltage V21 changes along with the common mode voltage of the voltage Vin1. The second voltage generating circuit 220 may generate a second voltage V22, wherein the second voltage V22 is related to the voltage Vin2 of the second input terminal of the amplifier 100. For instance, the second voltage V22 changes along with the common mode voltage of the voltage Vin2.

A first input terminal of the first multiplexer 230 is coupled to an output terminal of the first voltage generating circuit 210 to receive the first voltage V21. A second input terminal of the first multiplexer 230 is coupled to an output terminal of the second voltage generating circuit 220 to receive the second voltage V22. During the first period, the first multiplexer 230 selects to transmit the first voltage V21 to the first tail current source of the input stage circuit 120 to serve as the first bias voltage VBN1. During the second period, the first multiplexer 230 selects to transmit the second voltage V22 to the first tail current source of the input stage circuit 120 to serve as the first bias voltage VBN1. Based on the switching operation of the first multiplexer 230, the first bias voltage VBN1 is related to the voltage Vin1 during the first period, and the first bias voltage VBN1 is related to the voltage Vin2 during the second period.

A first input terminal of the second multiplexer 240 is coupled to the output terminal of the second voltage generating circuit 220 to receive the second voltage V22. A second input terminal of the second multiplexer 240 is coupled to an output terminal of the first voltage generating circuit 210 to receive the first voltage V21. During the first period, the second multiplexer 240 selects to transmit the second voltage V22 to the second tail current source of the input stage circuit 120 to serve as the second bias voltage VBN2. During the second period, the second multiplexer 240 selects to transmit the first voltage V21 to the second tail current source of the input stage circuit 120 to serve as the second bias voltage VBN2. Based on the switching operation of the second multiplexer 240, the second bias voltage VBN2 is related to the voltage Vin2 during the first period, and the second bias voltage VBN2 is related to the voltage Vin1 during the second period.

The implementation manners of the first voltage generating circuit 210 and/or the second voltage generating circuit 220 are not limited in the embodiment. For instance, based on a design requirement, the first voltage generating circuit 210 and/or the second voltage generating circuit 220 may include voltage regulators or other voltage generating circuits. In the embodiment illustrated in FIG. 2, the voltage Vin1 of the first input terminal of the amplifier 100 includes a differential voltage pair (i.e., including Vin1P and Vin1N), and the first voltage generating circuit 210 includes a current source 211, a transistor 212, a transistor 213 and a transistor 214. The first voltage generating circuit 210 may generate the first voltage V21 including the differential voltage pair Vin1P and Vin1N. In the embodiment illustrated in FIG. 2, the voltage Vin2 of the second input terminal of the amplifier 100 includes another differential voltage pair (i.e., including Vin2P and Vin2N), and implementation details related to the second voltage generating circuit 220 may be inferred with reference to those related to the first voltage generating circuit 210 and thus, will not be repeatedly described. The second voltage generating circuit 220 may generate the second voltage V22 according to the differential voltage pair Vin2P and Vin2N.

In the embodiment illustrated in FIG. 2, a current drain terminal of the current source 211 is coupled to a fixed voltage (for example, a system voltage VDD). A current supply terminal of the current source 211 is coupled to an output terminal of the first voltage generating circuit 210 to provide the first voltage V21 to the first input terminal of the first multiplexer 230 and the second input terminal of the second multiplexer 240. A control terminal (for example, a gate) of the transistor 212 may receive the first terminal voltage Vin1P of the differential voltage pair. A first terminal (for example, a drain) of the transistor 212 is coupled to the current supply terminal of the current source 211. A control terminal (for example, a gate) of the transistor 213 may receive the second terminal voltage Vin1N in the differential voltage pair. A first terminal (for example, a drain) of the transistor 213 is coupled to the current supply terminal of the current source 211. A control terminal (for example, a gate) of the transistor 214 is coupled to an output terminal of the first voltage generating circuit 210 to receive the first voltage V21. A first terminal (for example, a drain) of the transistor 214 is coupled to a second terminal (for example, a source) of the transistor 212 and a second terminal (for example, a source) of the transistor 213. A second terminal (for example, a source) of the transistor 214 is coupled to a reference voltage (for example, a ground voltage GND).

Figure 3:
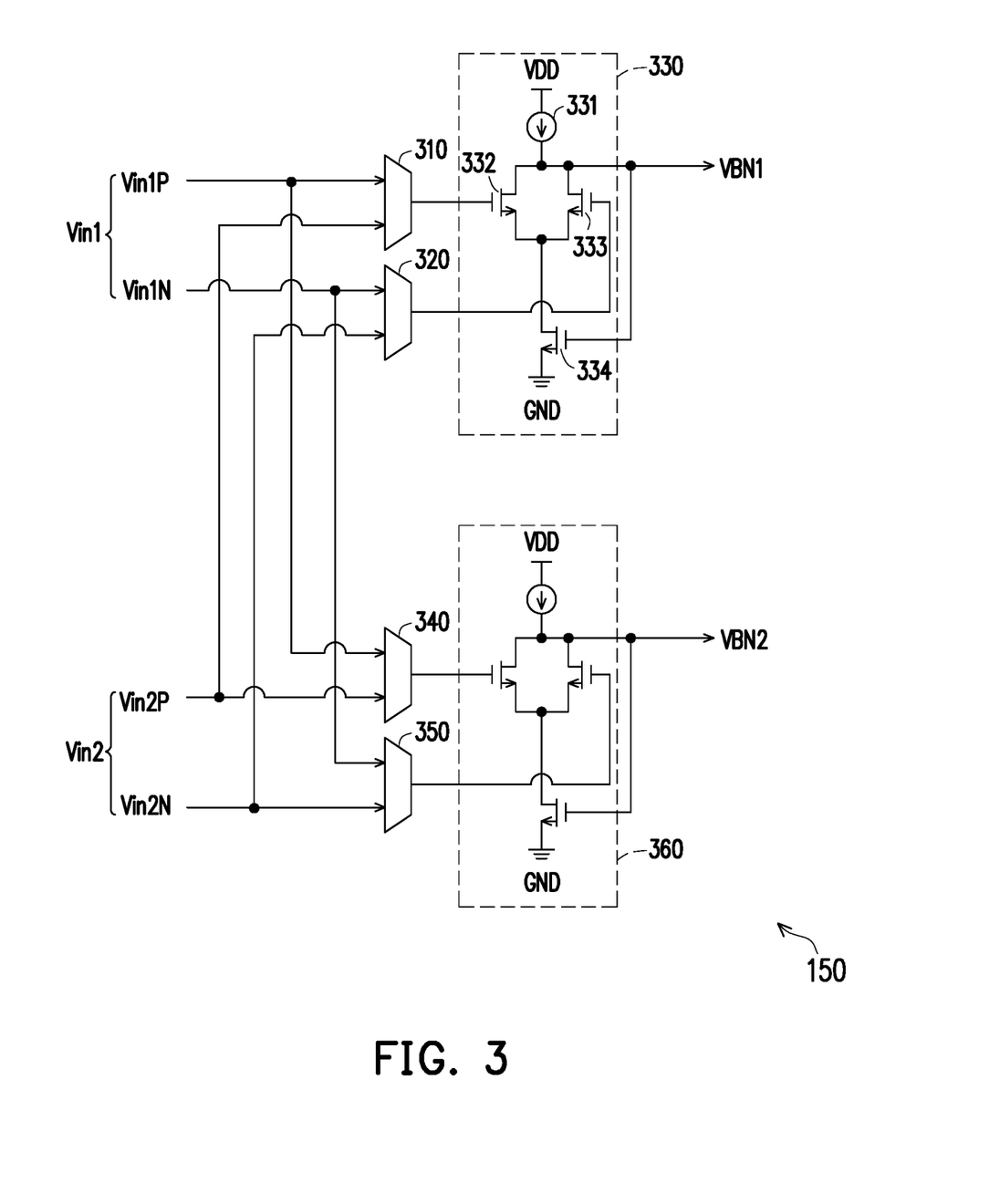
FIG. 3 is a schematic circuit block diagram illustrating the bias voltage generating circuit depicted in FIG. 1 according to another embodiment of the invention.

FIG. 3 is a schematic circuit block diagram illustrating the bias voltage generating circuit 150 depicted in FIG. 1 according to another embodiment of the invention. In the embodiment illustrated in FIG. 3, the bias voltage generating circuit 150 includes a first multiplexer (switch) 310, a second multiplexer (switch) 320, a first voltage generating circuit 330, a third multiplexer (switch) 340, a fourth multiplexer (switch) 350 and a second voltage generating circuit 360. The voltage Vin1 of the first input terminal of the amplifier 100 includes the first differential voltage pair (i.e., including Vin1P and Vin1N), and the voltage Vin2 of the second input terminal of the amplifier 100 includes the second differential voltage pair (i.e., including Vin2P and Vin2N).

A first input terminal of the first multiplexer 310 is configured to receive the first terminal voltage Vin1P in the first differential voltage pair. A second input terminal of the first multiplexer 310 is configured to receive the first terminal voltage Vin2P in the second differential voltage pair. During the first period, the first multiplexer 310 selects to output the first terminal voltage Vin1P in the first differential voltage pair to the first voltage generating circuit 330. During the second period, the first multiplexer 310 selects to output the first terminal voltage Vin2P in the second differential voltage pair to the first voltage generating circuit 330.

A first input terminal of the second multiplexer 320 is configured to receive the second terminal voltage Vin1N in the first differential voltage pair. A second input terminal of the second multiplexer 320 is configured to receive the second terminal voltage Vin2N in the second differential voltage pair. During the first period, the second multiplexer 320 selects to output the second terminal voltage Vin1N in the first differential voltage pair to the first voltage generating circuit 330. During the second period, the second multiplexer 320 selects to output the second terminal voltage Vin2N in the second differential voltage pair to the first voltage generating circuit 330.

A first input terminal of the first voltage generating circuit 330 is coupled to an output terminal of the first multiplexer 310. A second input terminal of the first voltage generating circuit 330 is coupled to an output terminal of the second multiplexer 320. The first voltage generating circuit 330 may generate the first bias voltage VBN1 to the first tail current source of the input stage circuit 120. Based on the switching operation of the first multiplexer 310 and the second multiplexer 320, the first bias voltage VBN1 is related to the voltage Vin1 during the first period, and the first bias voltage VBN1 is related to the voltage Vin2 during the second period.

In the embodiment illustrated in FIG. 3, the first voltage generating circuit 330 includes a current source 331, a transistor 332, a transistor 333 and a transistor 334. A current drain terminal of the current source 331 is coupled to the fixed voltage (for example, the system voltage VDD). A current supply terminal of the current source 331 is coupled to the first tail current source of the input stage circuit 120 to provide the first bias voltage VBN1. A control terminal (for example, a gate) of the transistor 332 is coupled to a first input terminal of the first voltage generating circuit 220, i.e., coupled to the output terminal of the first multiplexer 310. A first terminal (for example, a drain) of the transistor 332 is coupled to the current supply terminal of the current source 331. A control terminal (for example, a gate) of the transistor 333 is coupled to the second input terminal of the first voltage generating circuit 330, i.e., coupled to the output terminal of the second multiplexer 320. A first terminal (for example, a drain) of the transistor 333 is coupled to the current supply terminal of the current source 331. A control terminal (for example, a gate) of the transistor 334 is coupled to the current supply terminal of the current source 331. A first terminal (for example, a drain) of the transistor 334 is coupled to a second terminal (for example, a source) of the transistor 332 and a second terminal (for example, a source) of the transistor 333. A second terminal (for example, a source) of the transistor 334 is coupled to the reference voltage (for example, the ground voltage GND).

A first input terminal of the third multiplexer 340 is configured to receive the first terminal voltage Vin2P in the second differential voltage pair. A second input terminal of the third multiplexer 340 is configured to receive the first terminal voltage Vin1P in the first differential voltage pair. During the first period, the third multiplexer 340 selects to output the first terminal voltage Vin2P in the second differential voltage pair to the second voltage generating circuit 360. During the second period, the third multiplexer 340 selects to output the first terminal voltage Vin1P in the first differential voltage pair to the second voltage generating circuit 360.

A first input terminal of the fourth multiplexer 350 is configured to receive the second terminal voltage Vin2N in the second differential voltage pair. A second input terminal of the fourth multiplexer 350 is configured to receive the second terminal voltage Vin1N in the first differential voltage pair. During the first period, the fourth multiplexer 350 selects to output the second terminal voltage Vin2N in the second differential voltage pair to the second voltage generating circuit 360. During the second period, the fourth multiplexer 350 selects to output the second terminal voltage Vin1N in the first differential voltage pair to the second voltage generating circuit 360.

A first input terminal of the second voltage generating circuit 360 is coupled to an output terminal of the third multiplexer 340. A second input terminal of the second voltage generating circuit 360 is coupled to an output terminal of the fourth multiplexer 350. The second voltage generating circuit 360 may generate the second bias voltage VBN2 to the second tail current source of the input stage circuit 120. Implementation details related to the second voltage generating circuit 360 may be inferred with reference to those related to the first voltage generating circuit 330 and thus, will not be repeatedly described. Based on the switching operation of the third multiplexer 340 and the fourth multiplexer 350, the second bias voltage VBN2 is related to the voltage Vin2 during the first period, and the second bias voltage VBN2 is related to the voltage Vin1 during the second period.

Figure 4:
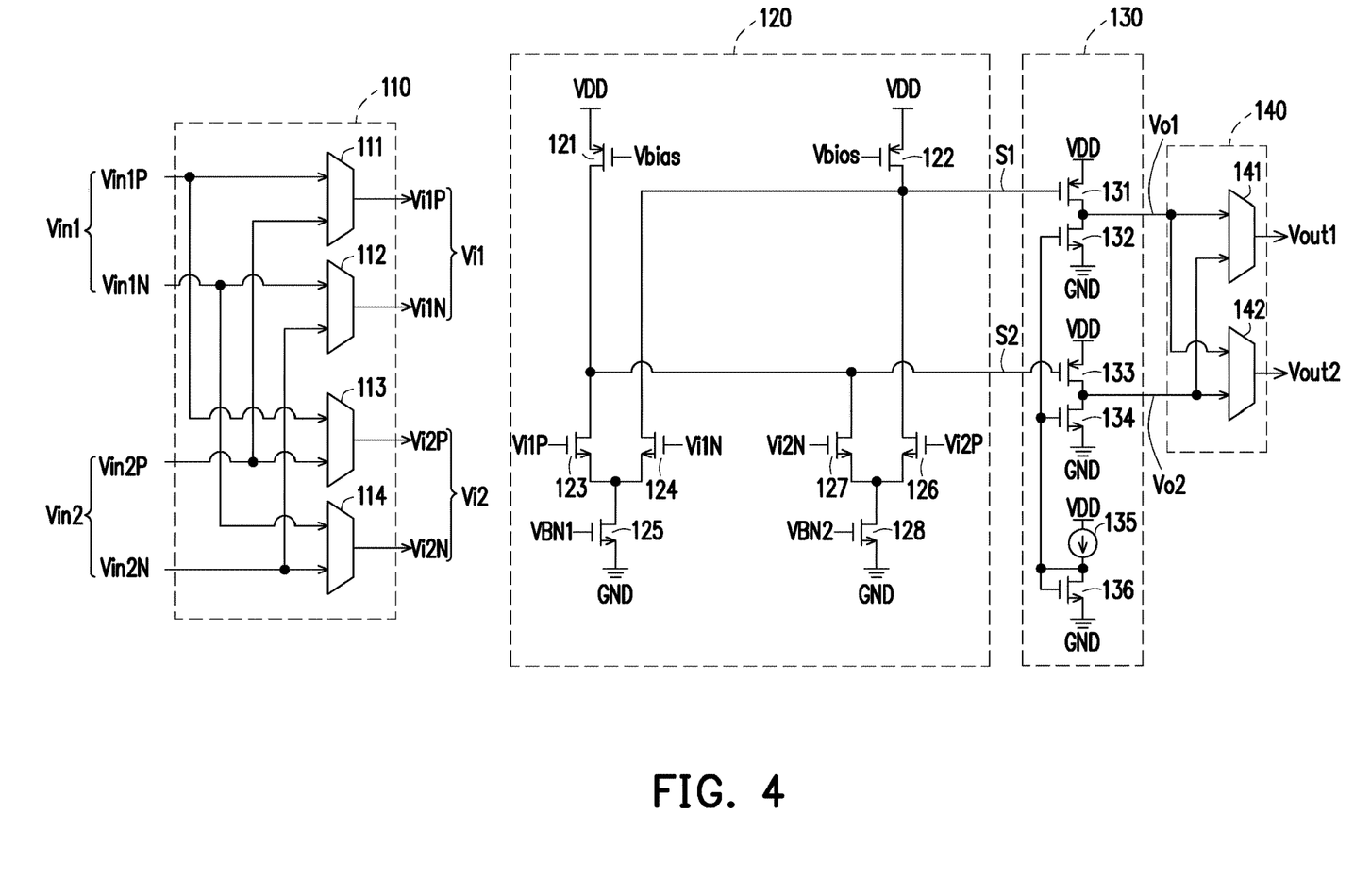
FIG. 4 is a schematic circuit block diagram illustrating the first routing circuit, the input stage circuit, the output stage circuit and the second routing circuit depicted in FIG. 1 according to an embodiment of the invention.

FIG. 4 is a schematic circuit block diagram illustrating the first routing circuit 110, the input stage circuit 120, the output stage circuit 130 and the second routing circuit 140 depicted in FIG. 1 according to an embodiment of the invention. The related descriptions of the embodiments illustrated in FIG. 2 and/or FIG. 3 may also be applicable to the embodiment illustrated in FIG. 4. In the embodiment illustrated in FIG. 4, the first routing circuit 110 includes a multiplexer (switch) 111, a multiplexer (switch) 112, a multiplexer (switch) 113 and a multiplexer (switch) 114. The voltage Vin1 of the first input terminal of the amplifier 100 includes the first differential voltage pair (i.e., including Vin1P and Vin1N), and the voltage Vin2 of the second input terminal of the amplifier 100 includes the second differential voltage pair (i.e., including Vin2P and Vin2N).

A first input terminal of the multiplexer 111 is configured to receive the first terminal voltage Vin1P in the first differential voltage pair. A second input terminal of the multiplexer 111 is configured to receive the first terminal voltage Vin2P in the second differential voltage pair. During the first period, the multiplexer 111 selects the first terminal voltage Vin1P in the first differential voltage pair to serves as a first terminal signal Vi1P in the input signal Vi1 and outputs the first terminal signal Vi1P to the input stage circuit 120. During the second period, the multiplexer 111 selects the first terminal voltage Vin2P in the second differential voltage pair to serve as the first terminal signal Vi1P in the input signal Vi1 and outputs the first terminal signal Vi1P to the input stage circuit 120.

A first input terminal of the multiplexer 112 is configured to receive the second terminal voltage Vin1N in the first differential voltage pair. A second input terminal of the multiplexer 112 is configured to receive the second terminal voltage Vin2N in the second differential voltage pair. During the first period, the multiplexer 112 selects the second terminal voltage Vin1N in the first differential voltage pair to serve as a second terminal signal Vi1N in the input signal Vi1 and outputs the second terminal signal Vi1N to the input stage circuit 120. During the second period, the multiplexer 112 selects the second terminal voltage Vin2N in the second differential voltage pair to serve as the second terminal signal Vi1N in the input signal Vi1 and outputs the second terminal signal Vi1N to the input stage circuit 120.

A first input terminal of the multiplexer 113 is configured to receive the first terminal voltage Vin2P in the second differential voltage pair. A second input terminal of the multiplexer 113 is configured to receive the first terminal voltage Vin1P in the first differential voltage pair. During the first period, the multiplexer 113 selects the first terminal voltage Vin2P in the second differential voltage pair to serve as a first terminal signal Vi2P in the input signal Vi2 and outputs the first terminal signal Vi2P to the input stage circuit 120. During the second period, the multiplexer 113 selects the first terminal voltage Vin1P in the first differential voltage pair to serve as the first terminal signal Vi2P in the input signal Vi2 and outputs the first terminal signal Vi2P to the input stage circuit 120.

A first input terminal of the multiplexer 114 is configured to receive the second terminal voltage Vin2N in the second differential voltage pair. A second input terminal of the multiplexer 114 is configured to receive the second terminal voltage Vin1N in the first differential voltage pair. During the first period, the multiplexer 114 selects the second terminal voltage Vin2N in the second differential voltage pair to serve as a second terminal signal Vi2N in the input signal Vi2 and outputs the second terminal signal Vi2N to the input stage circuit 120. During the second period, the multiplexer 114 selects the second terminal voltage Vin1N in the first differential voltage pair to serve as the second terminal signal Vi2N in the input signal Vi2 and outputs the second terminal signal Vi2N to the input stage circuit 120.

In the embodiment illustrated in FIG. 4, the first input terminal of the input stage circuit 120 is a differential terminal pair (which is referred to as a first differential terminal pair), and the second input terminal of the input stage circuit 120 is a differential terminal pair (which is referred to as a second differential terminal pair). The input stage circuit 120 includes a transistor 121, a transistor 122, a transistor 123, a transistor 124, a transistor 125, a transistor 126, a transistor 127 and a transistor 128.

A control terminal (for example, a gate) of the transistor 121 is configured to receive a bias voltage Vbias. The bias voltage Vbias may be determined according to a design requirement. A first terminal (for example, a source) of the transistor 121 is coupled to a fixed voltage (for example, system voltage VDD). A second terminal (for example, a drain) of the transistor 121 is coupled to the second output terminal of the input stage circuit 120 to provide signal S2 to the second input terminal of the output stage circuit 130. A control terminal (for example, a gate) of the transistor 122 is configured to receive the bias voltage Vbias. A first terminal (for example, a source) of the transistor 122 is coupled to the fixed voltage (for example, the system voltage VDD). A second terminal (for example, a drain) of the transistor 122 is coupled to the first output terminal of the input stage circuit 120 to provide the signal S1 to the first input terminal of the output stage circuit 130.

A control terminal (for example, a gate) of the transistor 123 is coupled to a first terminal of the first differential terminal pair of the input stage circuit 120 to receive the first terminal signal Vi1P in the input signal Vi1. A first terminal (for example, a drain) of the transistor 123 is coupled to the second terminal of the transistor 121. A control terminal (for example, a gate) of the transistor 124 is coupled to a second terminal of the first differential terminal pair of the input stage circuit 120 to receive the second terminal signal Vi1N in the input signal Vi1. A first terminal (for example, a drain) of the transistor 124 is coupled to the second terminal of the transistor 122. The transistor 125 may be considered as the first tail current source. A control terminal (for example, a gate) of the transistor 125 is coupled to the bias voltage generating circuit 150 to receive the first bias voltage VBN1. During the first period, the first bias voltage VBN1 changes along with the common mode voltage of the voltage Vin1. During the second period, the first bias voltage VBN1 changes along with the common mode voltage of the voltage Vin2. A first terminal (for example, a drain) of the transistor 125 is coupled to a second terminal (for example, a source) of the transistor 123 and a second terminal (for example, a source) of the transistor 124. A second terminal (for example, a source) of the transistor 125 is coupled to a reference voltage (for example, ground voltage GND).

A control terminal (for example, a gate) of the transistor 126 is coupled to a first terminal of the second differential terminal pair of the input stage circuit 120 to receive the first terminal signal Vi2P in the input signal Vi2. A first terminal (for example, a drain) of the transistor 126 is coupled to the second terminal of the transistor 122. A control terminal (for example, a gate) of the transistor 127 is coupled to a second terminal of the second differential terminal pair of the input stage circuit 120 to receive the second terminal signal Vi2N in the input signal Vi2. A first terminal (for example, a drain) of the transistor 127 is coupled to the second terminal of the transistor 121. The transistor 128 may be considered as the second tail current source. A control terminal (for example, a gate) of the transistor 128 is coupled to the bias voltage generating circuit 150 to receive the second bias voltage VBN2. During the first period, the second bias voltage VBN2 changes along with the common mode voltage of the voltage Vin2. During the second period, the second bias voltage VBN2 changes along with the common mode voltage of the voltage Vin1. A first terminal (for example, a drain) of the transistor 128 is coupled to a second terminal (for example, a source) of the transistor 126 and a second terminal (for example, a source) of the transistor 127. A second terminal (for example, a source) of the transistor 128 is coupled to the reference voltage (for example, the ground voltage GND).

When the first routing circuit 110 is switched between the input signal Vi1 and the input signal Vi2, the bias voltage generating circuit 150 is also synchronously switched between the first bias voltage VBN1 and the second bias voltage VBN2. Thus, a current flowing through the first tail current source (transistor 125), a current flowing through the second tail current source (transistor 128) and a current source may be maintained in consistency with one other. In this way, when the amplifier 100 performs gain control, the gain linearity of the amplifier 100 may be maintained.

In the embodiment illustrated in FIG. 4, the output stage circuit 130 includes a transistor 131, a transistor 132, a transistor 133, a transistor 134, a current source 135 and a transistor 136. A control terminal (for example, a gate) of the transistor 131 is configured to be coupled to the first input terminal of the output stage circuit 130 to receive the signal S1. A first terminal (for example, a source) of the transistor 131 is coupled to the fixed voltage (for example, the system voltage VDD). A second terminal (for example, a drain) of the transistor 131 is coupled to the first output terminal of the output stage circuit 130 to provide the first output signal Vo1 to the first input terminal of the second routing circuit 140. A first terminal (for example, a drain) of the transistor 132 is coupled to the second terminal of the transistor 131. A second terminal (for example, a source) of the transistor 132 is coupled to the reference voltage (for example, the ground voltage GND).

A control terminal (for example, a gate) of the transistor 133 is configured to be coupled to the second input terminal of the output stage circuit 130 to receive the signal S2. A first terminal (for example, a source) of the transistor 133 is coupled to the fixed voltage (for example, system voltage VDD). A second terminal (for example, a drain) of the transistor 133 is coupled to the second output terminal of the output stage circuit 130 to provide the second output signal Vo2 to the second input terminal of second routing circuit 140. A first terminal (for example, a drain) of the transistor 134 is coupled to the second terminal of the transistor 133. A second terminal (for example, a source) of the transistor 134 is coupled to the reference voltage (for example, the ground voltage GND).

A current drain terminal of the current source 135 is coupled to the fixed voltage (for example, the system voltage VDD). A current supply terminal of the current source 135 is coupled to a control terminal (for example, a gate) of the transistor 132 and a control terminal (for example, a gate) of the transistor 134. A control terminal (for example, a gate) and a first terminal (for example, a drain) of the transistor 136 are coupled to the current supply terminal of the current source 135. A second terminal (for example, a source) of the transistor 136 is coupled to the reference voltage (for example, the ground voltage GND).

In the embodiment illustrated in FIG. 4, the second routing circuit 140 includes a multiplexer (switch) 141 and a multiplexer (switch) 142. A first input terminal of the multiplexer 141 is coupled to the first output terminal of the output stage circuit 130 to receive the first output signal Vo1. A second input terminal of the multiplexer 141 is coupled to the second output terminal of the output stage circuit 130 to receive the second output signal Vo2. During the first period, the multiplexer 141 selects to output the first output signal Vo1 to serve as the first output voltage Vout1 of the amplifier 100. During the second period, the multiplexer 141 selects to output the second output signal Vo2 to serve as the first output voltage Vout1 of the amplifier 100.

A first input terminal of the multiplexer 142 is coupled to the second output terminal of the output stage circuit 130 to receive the second output signal Vo2. A second input terminal of the multiplexer 142 is coupled to the first output terminal of the output stage circuit 130 to receive the first output signal Vo1. During the first period, the multiplexer 142 selects to output the second output signal Vo2 to serve as the second output voltage Vout2 of the amplifier 100. During the second period, the multiplexer 142 selects to output the first output signal Vo1 to serve as the second output voltage Vout2 of the amplifier 100.

Figure 5:
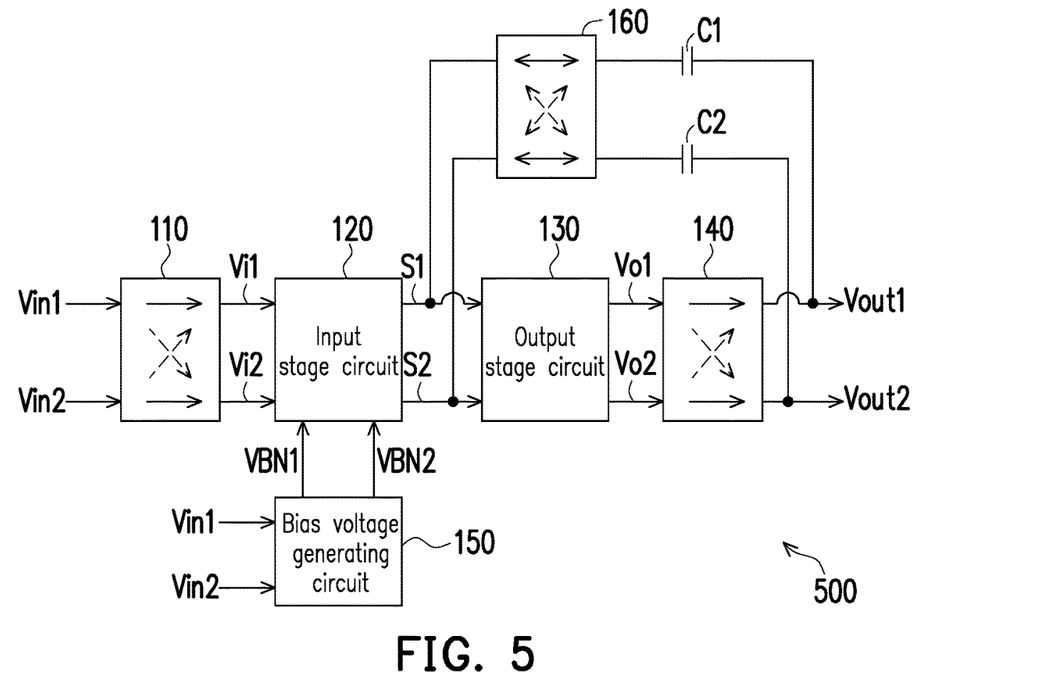
FIG. 5 is a schematic circuit block diagram illustrating an amplifier according to another embodiment of the invention.

FIG. 5 is a schematic circuit block diagram illustrating an amplifier 500 according to another embodiment of the invention. In the embodiment illustrated in FIG. 5, the amplifier 500 includes a first routing circuit 110, an input stage circuit 120, an output stage circuit 130, a second routing circuit 140, a bias voltage generating circuit 150, a compensation capacitor C1, a compensation capacitor C2 and a third routing circuit 160. The first routing circuit 110, the input stage circuit 120, the output stage circuit 130, the second routing circuit 140 and the bias voltage generating circuit 150 illustrated in FIG. 5 may be inferred with reference to the related descriptions of the embodiments illustrated in FIG. 1, FIG. 2, FIG. 3 and/or FIG. 4 and thus, will not be repeatedly described.

In the embodiment illustrated in FIG. 5, a first terminal of the compensation capacitor C1 is coupled to the first output terminal of the second routing circuit 140 to receive the first output voltage Vout1. A first terminal of the compensation capacitor C2 is coupled to the second output terminal of the second routing circuit 140 to receive the second output voltage Vout2. A first terminal of the third routing circuit 160 is coupled to the second terminal of the compensation capacitor C1. A second terminal of the third routing circuit 160 is coupled to a second terminal of the compensation capacitor C2. A third terminal of the third routing circuit 160 is coupled to the first output terminal of the input stage circuit 120 to receive the signal S1. A fourth terminal of the third routing circuit 160 is coupled to the second output terminal of the input stage circuit 120 to receive the signal S2.

During the first period, the third routing circuit 160 selectively couples the second terminal of the compensation capacitor C1 to the first output terminal of the input stage circuit 120 and selectively couples the second terminal of the compensation capacitor C2 to the second output terminal of the input stage circuit 120. During the second period, the third routing circuit 160 selectively couples the second terminal of the compensation capacitor C1 to the second output terminal of the input stage circuit 120 and selectively couples the second terminal of the compensation capacitor C2 to the first output terminal of the input stage circuit 120. In the embodiment illustrated in FIG. 5, during the switching process of the first routing circuit 110 and the second routing circuit 140, the compensation capacitor C1 and the compensation capacitor C2 may synchronously exchange with each other, so as to improve a slew rate.

Figure 6:
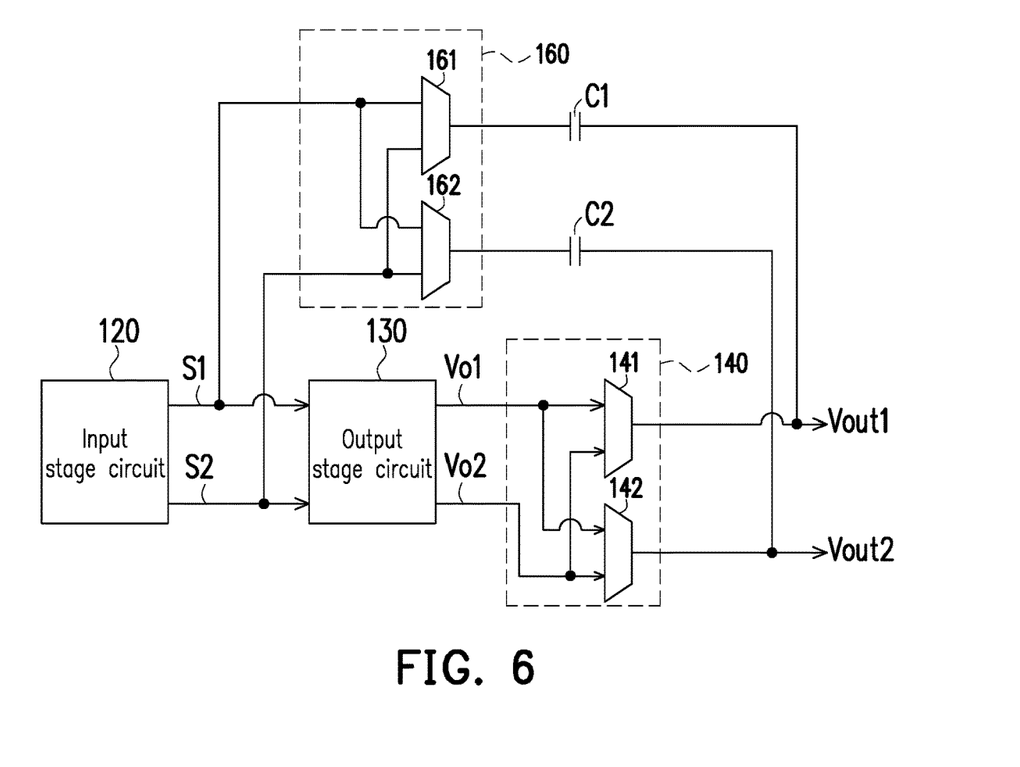
FIG. 6 is a schematic circuit block diagram illustrating the third routing circuit depicted in FIG. 5 according to an embodiment of the invention.

FIG. 6 is a schematic circuit block diagram illustrating the third routing circuit 160 depicted in FIG. 5 according to an embodiment of the invention. The input stage circuit 120, the output stage circuit 130 and the second routing circuit 140 illustrated in FIG. 6 may be inferred with reference to the related descriptions of the embodiments illustrated in FIG. 1, FIG. 2, FIG. 3 and/or FIG. 4 and thus, will not be repeatedly described. In the embodiment illustrated in FIG. 6, the third routing circuit 160 includes a multiplexer (switch) 161 and a multiplexer (switch) 162. A first selection terminal of the multiplexer 161 is coupled to the first output terminal of the input stage circuit 120 to receive the signal S1. A second selection terminal of the multiplexer 161 is coupled to the second output terminal of the input stage circuit 120 to receive the signal S2. A common terminal of the multiplexer 161 is coupled to the second terminal of the compensation capacitor C1. During the first period, the multiplexer 161 selectively transmits the signal S1 to the second terminal of the compensation capacitor C1. During the second period, the multiplexer 161 selectively transmits the signal S2 to the second terminal of the compensation capacitor C1.

A first selection terminal of the multiplexer 162 is coupled to the second output terminal of the input stage circuit 120 to receive the signal S2. A second selection terminal of the multiplexer 162 is coupled to the first output terminal of the input stage circuit 120 to receive the signal S1. A common terminal of the multiplexer 162 is coupled to the second terminal of the compensation capacitor C2. During the first period, the multiplexer 162 selectively transmits the signal S2 to the second terminal of the compensation capacitor C2. During the second period, the multiplexer 162 selectively transmits the signal S1 to the second terminal of the compensation capacitor C2.

Figure 7:
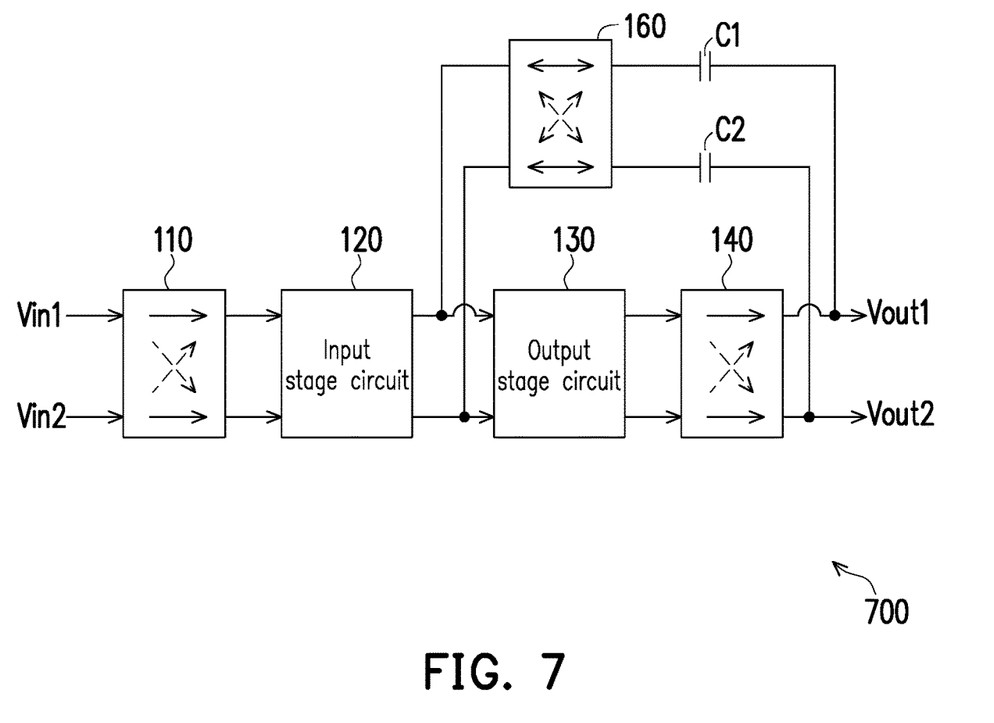
FIG. 7 is a schematic circuit block diagram illustrating an amplifier according to yet another embodiment of the invention.

FIG. 7 is a schematic circuit block diagram illustrating an amplifier 700 according to yet another embodiment of the invention. In the embodiment illustrated in FIG. 7, the amplifier 700 includes a first routing circuit 110, an input stage circuit 120, an output stage circuit 130, a second routing circuit 140, a compensation capacitor C1, a compensation capacitor C2 and a third routing circuit 160. The first routing circuit 110, the input stage circuit 120, the output stage circuit 130 and the second routing circuit 140 illustrated in FIG. 7 may be inferred with reference to the related descriptions of the embodiments illustrated in FIG. 1, FIG. 2, FIG. 3 and/or FIG. 4 and thus, will not be repeatedly described. In the embodiment illustrated in FIG. 7, bias voltages (for example, VBN1 and/or VBN2) of a tail current source in the input stage circuit 120 may be set to be a specific fixed voltage, wherein the fixed voltage may be determined according to a design requirement. The compensation capacitor C1, the compensation capacitor C2 and the third routing circuit 160 illustrated in FIG. 7 may be inferred with reference to the related descriptions of the embodiments illustrated in FIG. 5 and/or FIG. 6 and thus, will not be repeatedly described.

In light of the foregoing, the amplifier provided by the embodiments of the invention uses the first routing circuit and the second routing circuit as the choppers for offsetting offset voltages. In some embodiments, during the switching process of the first routing circuit and the second routing circuit, the bias voltage generating circuit can synchronously change between the first bias voltage and the second bias voltage, so as to maintain the gain linearity of the amplifier. In some other embodiments, during the switching process of the first routing circuit and the second routing circuit, the first compensation capacitor and the second compensation capacitor can synchronously exchange with each other, so as to improve the slew rate.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims.

What is claimed is:

1. An amplifier, comprising:
   a first routing circuit, having a first input terminal and a second input terminal respectively coupled to a first input terminal and a second input terminal of the amplifier;
   an input stage circuit, having a first input terminal and a second input terminal respectively coupled to a first output terminal and a second output terminal of the first routing circuit;
   an output stage circuit, having a first input terminal and a second input terminal respectively coupled to a first output terminal and a second output terminal of the input stage circuit;
   a second routing circuit, having a first input terminal and a second input terminal respectively coupled to a first output terminal and a second output terminal of the output stage circuit, wherein a first output terminal and a second output terminal of the second routing circuit are respectively coupled to a first output terminal and a second output terminal of the amplifier; and
   a bias voltage generating circuit, configured to generate a first bias voltage and a second bias voltage according to voltages of the first input terminal and the second input terminal of the amplifier respectively provided to a first tail current source and a second tail current source of the input stage circuit, wherein the first bias voltage is related to the voltage of the first input terminal of the amplifier and the second bias voltage is related to the voltage of the second input terminal of the amplifier during a first period, and the first bias voltage is related to the voltage of the second input terminal of the amplifier and the second bias voltage is related to the voltage of the first input terminal of the amplifier during a second period.

2. The amplifier according to claim 1, wherein the first bias voltage is independent of the second bias voltage.

3. The amplifier according to claim 1, wherein
during the first period, the first input terminal of the first routing circuit is selectively coupled to the first output terminal of the first routing circuit, the second input terminal of the first routing circuit is selectively coupled to the second output terminal of the first routing circuit, the first input terminal of the second routing circuit is selectively coupled to the first output terminal of the second routing circuit, and the second input terminal of the second routing circuit is selectively coupled to the second output terminal of the second routing circuit, and during the second period, the first input terminal of the first routing circuit is selectively coupled to the second output terminal of the first routing circuit, the second input terminal of the first routing circuit is selectively coupled to the first output terminal of the first routing circuit, the first input terminal of the second routing circuit is selectively coupled to the second output terminal of the second routing circuit, and the second input terminal of the second routing circuit is selectively coupled to the first output terminal of the second routing circuit.

4. The amplifier according to claim 1, wherein the bias voltage generating circuit comprises:
a first voltage generating circuit, configured to generate a first voltage related to the voltage of the first input terminal of the amplifier;
a second voltage generating circuit, configured to generate a second voltage related to the voltage of the second input terminal of the amplifier;
a first multiplexer, having a first input terminal coupled to an output terminal of the first voltage generating circuit to receive the first voltage, wherein a second input terminal of the first multiplexer is coupled to an output terminal of the second voltage generating circuit to receive the second voltage, the first multiplexer selecting to transmit the first voltage to the first tail current source of the input stage circuit to serve as the first bias voltage during the first period, and the first multiplexer selecting to transmit the second voltage to the first tail current source of the input stage circuit to serve as the first bias voltage during the second period; and
a second multiplexer, having a first input terminal coupled to the output terminal of the second voltage generating circuit to receive the second voltage, wherein a second input terminal of the second multiplexer is coupled to the output terminal of the first voltage generating circuit to receive the first voltage, the second multiplexer selecting to transmit the second voltage to the second tail current source of the input stage circuit to serve as the second bias voltage during the first period, and the second multiplexer selecting to transmit the first voltage to the second tail current source of the input stage circuit to serve as the second bias voltage during the second period.

5. The amplifier according to claim 4, wherein the voltage of the first input terminal of the amplifier comprises a differential voltage pair, and the first voltage generating circuit comprises:
a current source, having a current supply terminal coupled to the output terminal of the first voltage generating circuit;
a first transistor, having a control terminal configured to receive a first terminal voltage in the differential voltage pair, wherein a first terminal of the first transistor is coupled to the current supply terminal of the current source;
a second transistor, having a control terminal configured to receive a second terminal voltage in the differential voltage pair, wherein a first terminal of the first transistor is coupled to the current supply terminal of the current source; and
a third transistor, having a control terminal coupled to the output terminal of the first voltage generating circuit, wherein a first terminal of the third transistor is coupled to a second terminal of the first transistor and a second terminal of the second transistor, and a second terminal of the third transistor is coupled to a reference voltage.

6. The amplifier according to claim 1, wherein the voltage of the first input terminal of the amplifier comprises a first differential voltage pair, the voltage of the second input terminal of the amplifier comprises a second differential voltage pair, and the bias voltage generating circuit comprises:
a first multiplexer, having a first input terminal configured to receive a first terminal voltage in the first differential voltage pair and a second input terminal configured to receive a first terminal voltage in the second differential voltage pair, the first multiplexer selecting to output the first terminal voltage in the first differential voltage pair during the first period, and the first multiplexer selecting to output the first terminal voltage in the second differential voltage pair during the second period;
a second multiplexer, having a first input terminal configured to receive a second terminal voltage in the first differential voltage pair and a second input terminal configured to receive a second terminal voltage in the second differential voltage pair, the second multiplexer selecting to output the second terminal voltage in the first differential voltage pair during the first period, and the second multiplexer selecting to output the second terminal voltage in the second differential voltage pair during the second period;
a first voltage generating circuit, having a first input terminal coupled to an output terminal of the first multiplexer and a second input terminal coupled to an output terminal of the second multiplexer, and configured to generate the first bias voltage to the first tail current source of the input stage circuit;
a third multiplexer, having a first input terminal configured to receive the first terminal voltage in the second differential voltage pair and a second input terminal configured to receive the first terminal voltage in the first differential voltage pair, the third multiplexer selecting to output the first terminal voltage in the second differential voltage pair during the first period, and the third multiplexer selecting to output the first terminal voltage in the first differential voltage pair during the second period;

a fourth multiplexer, having a first input terminal configured to receive the second terminal voltage in the second differential voltage pair and a second input terminal configured to receive the second terminal voltage in the first differential voltage pair, the fourth multiplexer selecting to output the second terminal voltage in the second differential voltage pair during, and the fourth multiplexer selecting to output the second terminal voltage in the first differential voltage pair during the second period; and a second voltage generating circuit, having a first input terminal coupled to an output terminal of the third multiplexer, wherein a second input terminal of the second voltage generating circuit is coupled to an output terminal of the fourth multiplexer, and the second voltage generating circuit is configured to generate the second bias voltage to the second tail current source of the input stage circuit.

7. The amplifier according to claim 6, wherein the first voltage generating circuit comprises:

a current source, having a current supply terminal coupled to the first tail current source of the input stage circuit to be provided to the first bias voltage;

a first transistor, having a control terminal coupled to the first input terminal of the first voltage generating circuit, wherein a first terminal of the first transistor is coupled to the current supply terminal of the current source;

a second transistor, having a control terminal coupled to the second input terminal of the first voltage generating circuit, wherein a first terminal of the second transistor is coupled to the current supply terminal of the current source; and a third transistor, having a control terminal coupled to the current supply terminal of the current source, wherein a first terminal of the third transistor is coupled to a second terminal of the first transistor and a second terminal of the second transistor, and a second terminal coupled to a reference voltage.

8. The amplifier according to claim 1, wherein the first input terminal of the input stage circuit is a first differential terminal pair, the second input terminal of the input stage circuit is a second differential terminal pair, and the input stage circuit comprises:

a first transistor, having a control terminal configured to receive a third bias voltage, wherein a first terminal of the first transistor is coupled to a fixed voltage, and a second terminal of the first transistor is coupled to the second output terminal of the input stage circuit;

a second transistor, having a control terminal configured to receive the third bias voltage, wherein a first terminal of the second transistor is coupled to the fixed voltage, and a second terminal of the second transistor is coupled to the first output terminal of the input stage circuit;

a third transistor, having a control terminal coupled to a first terminal of the first differential terminal pair, wherein a first terminal of the third transistor is coupled to the second terminal of the first transistor;

a fourth transistor, having a control terminal coupled to a second terminal of the first differential terminal pair, wherein a first terminal of the fourth transistor is coupled to the second terminal of the second transistor;

a fifth transistor, having a control terminal coupled to the bias voltage generating circuit to receive the first bias voltage, wherein a first terminal of the fifth transistor is coupled to a second terminal of the third transistor and a second terminal of the fourth transistor, and a second terminal of the fifth transistor is coupled to a reference voltage;

a sixth transistor, having a control terminal coupled to a first terminal of the second differential terminal pair, wherein a first terminal of the sixth transistor is coupled to the second terminal of the second transistor;

a seventh transistor, having a control terminal coupled to a second terminal of the second differential terminal pair, wherein a first terminal of the seventh transistor is coupled to the second terminal of the first transistor; and an eighth transistor, having a control terminal coupled to the bias voltage generating circuit to receive the second bias voltage, wherein a first terminal of the eighth transistor is coupled to a second terminal of the sixth transistor and a second terminal of the seventh transistor, and a second terminal of the eighth transistor is coupled to the reference voltage.

9. The amplifier according to claim 1, wherein the output stage circuit comprises:

a first transistor, having a control terminal configured to be coupled to the first input terminal of the output stage circuit, wherein a first terminal of the first transistor is coupled to a fixed voltage, and a second terminal of the first transistor is coupled to the first output terminal of the output stage circuit;

a second transistor, having a first terminal coupled to the second terminal of the first transistor, wherein a second terminal of the second transistor is coupled to a reference voltage;

a third transistor, having a control terminal configured to be coupled to the second input terminal of the output stage circuit, wherein a first terminal of the third transistor is coupled to the fixed voltage, and a second terminal of the third transistor is coupled to the second output terminal of the output stage circuit;

a fourth transistor, having a first terminal coupled to the second terminal of the third transistor, wherein a second terminal of the fourth transistor is coupled to the reference voltage;

a current source, having a current supply terminal coupled to a control terminal of the second transistor and a control terminal of the fourth transistor; and a fifth transistor, having a control terminal and a first terminal coupled to the current supply terminal of the current source, wherein a second terminal of the fifth transistor is coupled to the reference voltage.

10. The amplifier according to claim 1, further comprising:

a first compensation capacitor, having a first terminal coupled to the first output terminal of the second routing circuit;

a second compensation capacitor, having a first terminal coupled to the second output terminal of the second routing circuit; and a third routing circuit, having a first terminal and a second terminal respectively coupled to a second terminal of the first compensation capacitor and a second terminal of the second compensation capacitor, wherein a third terminal and a fourth terminal of the third routing circuit respectively coupled to the first output terminal and the second output terminal of the input stage circuit, wherein during the first period, the third routing circuit selectively couples the second terminal of the first compensation capacitor to the first output terminal of the input stage circuit and selectively couples the second terminal of the second compensation capacitor to the second output terminal of the input stage circuit, and during the second period, the third routing circuit selectively couples the second terminal of the first compensation capacitor to the second output terminal of the input stage circuit and selectively couples the second terminal of the second compensation capacitor to the first output terminal of the input stage circuit.

11. An amplifier, comprising:

a first routing circuit, having a first input terminal and a second input terminal respectively coupled to a first input terminal and a second input terminal of the amplifier;

an input stage circuit, having a first input terminal and a second input terminal respectively coupled to a first output terminal and a second output terminal of the first routing circuit;

an output stage circuit, having a first input terminal and a second input terminal respectively coupled to a first output terminal and a second output terminal of the input stage circuit;

a second routing circuit, having a first input terminal and a second input terminal respectively coupled to a first output terminal and a second output terminal of the output stage circuit, wherein a first output terminal and a second output terminal of the second routing circuit respectively coupled to a first output terminal and a second output terminal of the amplifier;

a first compensation capacitor, having a first terminal coupled to the first output terminal of the second routing circuit;

a second compensation capacitor, having a first terminal coupled to the second output terminal of the second routing circuit; and a third routing circuit, having a first terminal and a second terminal respectively coupled to a second terminal of the first compensation capacitor and a second terminal of the second compensation capacitor, wherein a third terminal and a fourth terminal of the third routing circuit respectively coupled to the first output terminal and the second output terminal of the input stage circuit, wherein during a first period, the third routing circuit selectively couples the second terminal of the first compensation capacitor to the first output terminal of the input stage circuit and selectively couples the second terminal of the second compensation capacitor to the second output terminal of the input stage circuit, and wherein during a second period, the third routing circuit selectively couples the second terminal of the first compensation capacitor to the second output terminal of the input stage circuit and selectively couples the second terminal of the second compensation capacitor to the first output terminal of the input stage circuit.

12. The amplifier according to claim 11, wherein during the first period, the first input terminal of the first routing circuit is selectively coupled to the first output terminal of the first routing circuit, the second input terminal of the first routing circuit is selectively coupled to the second output terminal of the first routing circuit, the first input terminal of the second routing circuit is selectively coupled to the first output terminal of the second routing circuit, and the second input terminal of the second routing circuit is selectively coupled to the second output terminal of the second routing circuit, and during the second period, the first input terminal of the first routing circuit is selectively coupled to the second output terminal of the first routing circuit, the second input terminal of the first routing circuit is selectively coupled to the first output terminal of the first routing circuit, the first input terminal of the second routing circuit is selectively coupled to the second output terminal of the second routing circuit, and the second input terminal of the second routing circuit is selectively coupled to the first output terminal of the second routing circuit.

13. The amplifier according to claim 11, wherein the first input terminal of the input stage circuit is a first differential terminal pair, the second input terminal of the input stage circuit is a second differential terminal pair, and the input stage circuit comprises:

a first transistor, having a control terminal configured to receive a third bias voltage, wherein a first terminal of the first transistor is coupled to a fixed voltage, and a second terminal of the first transistor is coupled to the second output terminal of the input stage circuit;

a second transistor, having a control terminal configured to receive the third bias voltage, wherein a first terminal of the second transistor is coupled to the fixed voltage, and a second terminal of the second transistor is coupled to the first output terminal of the input stage circuit;

a third transistor, having a control terminal coupled to a first terminal of the first differential terminal pair, wherein a first terminal of the third transistor is coupled to the second terminal of the first transistor;

a fourth transistor, having a control terminal coupled to a second terminal of the first differential terminal pair, wherein a first terminal of the fourth transistor is coupled to the second terminal of the second transistor;

a fifth transistor, having a control terminal coupled to the bias voltage generating circuit to receive the first bias voltage, wherein a first terminal of the fifth transistor is coupled to a second terminal of the third transistor and a second terminal of the fourth transistor, and a second terminal of the fifth transistor is coupled to a reference voltage;

a sixth transistor, having a control terminal coupled to a first terminal of the second differential terminal pair, wherein a first terminal of the sixth transistor is coupled to the second terminal of the second transistor;

a seventh transistor, having a control terminal coupled to a second terminal of the second differential terminal pair, wherein a first terminal of the seventh transistor is coupled to the second terminal of the first transistor; and an eighth transistor, having a control terminal coupled to the bias voltage generating circuit to receive the second bias voltage, wherein a first terminal of the eighth transistor is coupled to a second terminal of the sixth transistor and a second terminal of the seventh transistor, and a second terminal of the eighth transistor is coupled to the reference voltage.

14. The amplifier according to claim 11, wherein the output stage circuit comprises:

a first transistor, having a control terminal configured to be coupled to the first input terminal of the output stage circuit, wherein a first terminal of the first transistor is coupled to a fixed voltage, and a second terminal of the first transistor is coupled to the first output terminal of the output stage circuit;

a second transistor, having a first terminal coupled to the second terminal of the first transistor, wherein a second terminal of the second transistor is coupled to a reference voltage;

a third transistor, having a control terminal configured to be coupled to the second input terminal of the output stage circuit, wherein a first terminal of the third transistor is coupled to the fixed voltage, and a second terminal of the third transistor is coupled to the second output terminal of the output stage circuit;

a fourth transistor, having a first terminal coupled to the second terminal of the third transistor, wherein a second terminal of the fourth transistor is coupled to the reference voltage;

a current source, having a current supply terminal coupled to a control terminal of the second transistor and a control terminal of the fourth transistor; and a fifth transistor, having a control terminal and a first terminal coupled to the current supply terminal of the current source, wherein a second terminal of the fifth transistor is coupled to the reference voltage.

* * * * *